(12) United States Patent
Takefman et al.

(10) Patent No.: US 9,449,651 B2
(45) Date of Patent: Sep. 20, 2016

(54) SYSTEM AND METHOD FOR OFFSETTING THE DATA BUFFER LATENCY OF A DEVICE IMPLEMENTING A JEDEC STANDARD DDR-4 LRDIMM CHIPSET

(71) Applicant: Diablo Technologies Inc., Ottawa (CA)

(72) Inventors: Michael L. Takefman, Nepean (CA); Maher Amer, Nepean (CA); Claus Reitlingshoefer, Kanata (CA)

(73) Assignee: DIABLO TECHNOLOGIES INC., Ottawa (CA)

( * ) Notice: Subject to any disclaimer, the term of this patent is extended or adjusted under 35 U.S.C. 154(b) by 0 days.

(21) Appl. No.: 14/664,580

(22) Filed: Mar. 20, 2015

(65) Prior Publication Data

US 2015/0294698 A1 Oct. 15, 2015

Related U.S. Application Data

(60) Provisional application No. 61/968,998, filed on Mar. 21, 2014.

(51) Int. Cl.
*G11C 7/10* (2006.01)
*G11C 7/22* (2006.01)
*G11C 5/04* (2006.01)

(52) U.S. Cl.
CPC ............... *G11C 5/04* (2013.01); *G11C 7/1066* (2013.01); *G11C 7/1093* (2013.01)

(58) Field of Classification Search
CPC .................................. G11C 7/10; G11C 7/22
See application file for complete search history.

(56) References Cited

U.S. PATENT DOCUMENTS

2010/0070690 A1* 3/2010 Amer .................... G11C 7/1051
711/103
2012/0204079 A1* 8/2012 Takefman ............. H03M 13/05
714/758

* cited by examiner

*Primary Examiner* — Hoai V Ho
*Assistant Examiner* — Tri Hoang

(57) ABSTRACT

A system and method for offsetting the data buffer latency in a CPIO device having a JEDEC standard DDR-4 LRDIMM chipset as the front end is disclosed. According to one embodiment, a CPIO ASIC provides variable timing control for its DDR-4 LRDIMM interface such that propagation delay of the data buffers can be offset by the CPIO ASIC, allowing the CPIO LRDIMM to be timing compatible with an RDIMM.

20 Claims, 8 Drawing Sheets

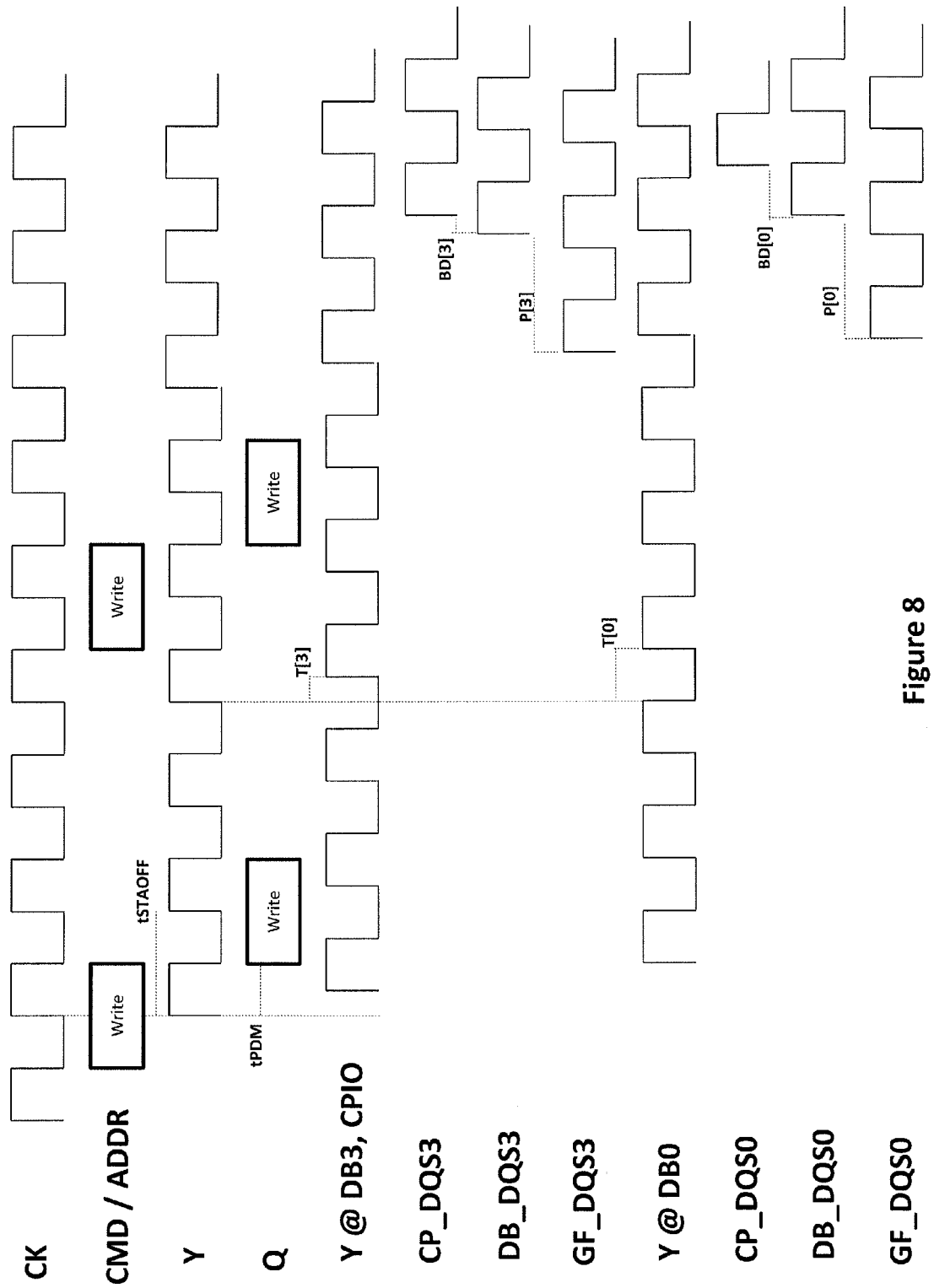

SYSTEM AND METHOD FOR OFFSETTING THE DATA BUFFER LATENCY OF A DEVICE IMPLEMENTING A JEDEC STANDARD DDR-4 LRDIMM CHIPSET

CROSS REFERENCES

This application claims the benefit of and priority to U.S. Provisional Application No. 61/968,998 filed on Mar. 21, 2014, entitled "SYSTEM AND METHOD FOR OFFSETTING THE DATA BUFFER LATENCY OF A DEVICE IMPLEMENTING A JEDEC STANDARD DDR-4 LRDIMM CHIPSET," the disclosure of which is hereby incorporated by reference in its entirety.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

RELATED FIELD

The present application relates in general to the field of computers, and in particular, to the connecting co-processors and input/output (I/O) devices on a computer system's main memory as a load-reduction dual in-line memory module (LRDIMM).

BACKGROUND

A dual in-line memory module (DIMM) generally refers to a module that contains one or more Random Access Memory (RAM) or Dynamic RAM (DRAM) chips on a small circuit board outfitted with certain pins for connecting to a computer motherboard. Known configurations for a DIMM include a 240-pin connector or a 160-pin connector and may support 64/72-bit data transfer. The memory devices of performance enhanced DIMMs are generally Synchronous DRAMs (SDRAMs), the terms DRAM and SDRAM being used interchangeably here.

A continuing demand for higher memory speed and capacity has led to the development of different types of DIMMs, including Registered DIMMs (RDIMMs) and LRDIMMs. An RDIMM, exemplarily shown in FIG. 1, contains a buffer that is used to reduce the loading of the clock, address, and control signals on the memory bus. An LRDIMM, exemplarily shown in FIG. 2, contains buffers for buffering the clock/address/control signals as well as for the data signals.

Although data buffering in LRDIMMS allows higher capacity modules to be developed, it also introduces additional latency compared to RDIMMs (which does not buffer data signals) due to a mismatch between the Data Queue Strobe (DQS) and when the data actually becomes available at the buffers. This additional data buffer latency of LRDIMMs creates a major issue when integrating LRDIMMs into a computer's memory system already using RDIMMs because all the DIMMs in a system are expected to have the same latency. If one DIMM is slower (i.e., longer latency), all the DIMMs are programmed with the longer latency by the host computer system. A further complication is that the delay through the data buffer is not an integer multiple of the clock period so a simple increase in the latency does not allow interoperation. The Joint Electron Device Engineering Council (JEDEC) standards, therefore, generally does not provide guidelines for using RDIMMs and LRDIMMs together. U.S. Pat. No. 8,452,917, however, provides a solution to the latency issue and discloses LRDIMMs that are timing compatible with RDIMMs.

The data buffer latency issue is not limited to LRDIMMs and also arises in co-processors and input/output devices (hereafter, "CPIO devices") that utilize an LRDIMM interface/front end to connect to a computer's main memory system, such as those described in the now-allowed U.S. patent application Ser. No. 13/303,048. In other words, a CPIO device that connects to the computer's main memory via an LRDIMM front end also exhibits additional latency (compared to an RDIMM) due to the data buffering and is generally not compatible with RDIMMs already being used on the main memory. Therefore, there exists a need for a system and method for offsetting the data buffer latency in a CPIO device having a JEDEC standard DDR-4 LRDIMM chipset as the front end such that the CPIO device would be timing compatible with an RDIMM.

SUMMARY

A system and method for offsetting the data buffer latency in a CPIO device having a JEDEC standard DDR-4 LRDIMM chipset as the front end is disclosed. According to one embodiment, a CPIO ASIC provides variable timing control for its DDR-4 LRDIMM interface such that propagation delay of the data buffers can be offset by the CPIO ASIC, allowing the CPIO LRDIMM to be timing compatible with an RDIMM.

BRIEF DESCRIPTION OF THE DRAWINGS

The accompanying drawings, which are included as part of the present specification, illustrate various embodiments and together with the general description given above, and the detailed description of the various embodiments given below serve to explain and teach the principles described herein.

FIG. 8 illustrates an exemplary timing diagram for a write operation on a CPIO LRDIMM, according to one embodiment.

The figures are not necessarily drawn to scale and elements of similar structures or functions are generally represented by like reference numerals for illustrative purposes throughout the figures. The figures are only intended to facilitate the description of the various embodiments

DETAILED DESCRIPTION

Figure 1:
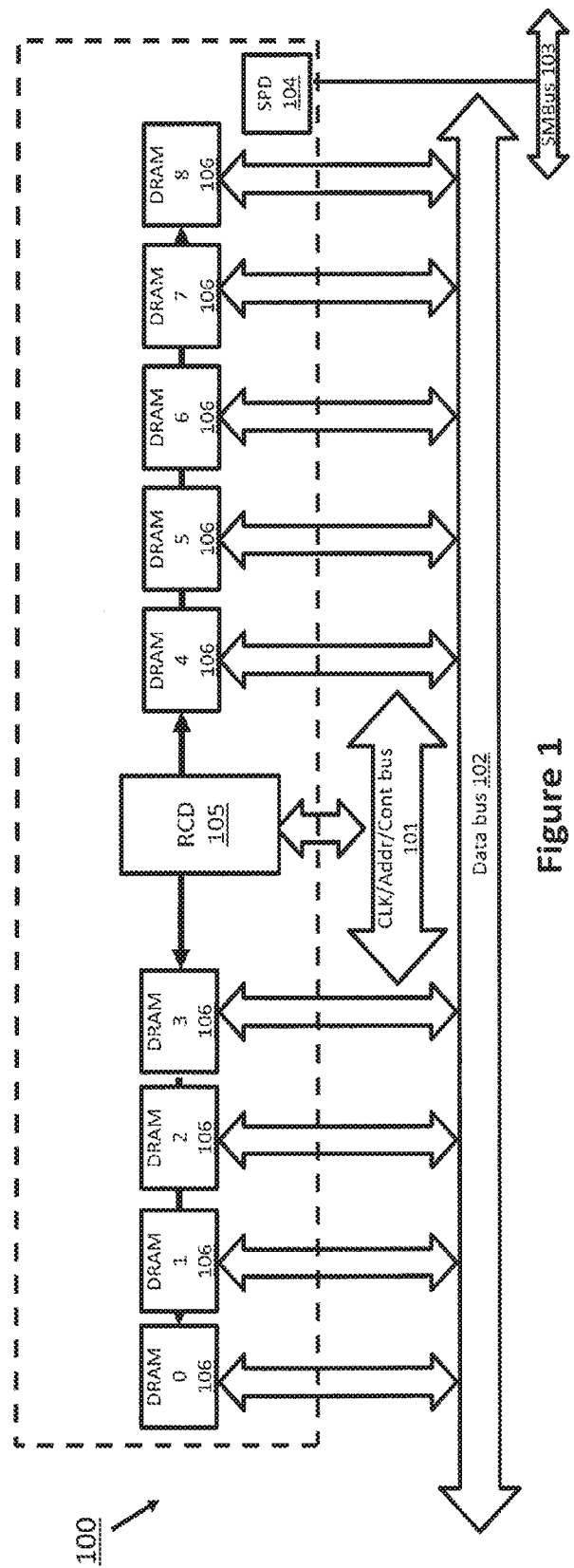
FIG. 1 illustrates a typical DDR-4 RDIMM configured to communicate with a host computer system.

Each of the features and teachings disclosed herein can be utilized separately or in conjunction with other features and teachings to provide a system and method for offsetting the data buffer latency in a CPIO device having a JEDEC standard DDR-4 LRDIMM chipset as the front end (hereafter, "CPIO LRDIMM"). Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present application. However, it will be apparent to one skilled in the art that these specific details are not required to practice the teachings of the present application.

Some portions of the detailed descriptions herein are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present application also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present application describes a system and method for offsetting the data buffer latency in a CPIO LRDIMM such that the CPIO LRDIMM would be timing compatible with an RDIMM. The present application is related to and incorporates by reference U.S. Pat. No. 8,452,917, entitled "Load reduction dual in-line memory module (LRDIMM) and method for programming the same," and now-allowed U.S. patent application Ser. No. 13/303,048, entitled "System and method of interfacing co-processors and input/output devices via a main memory system."

FIG. 1 shows a typical DDR-4 RDIMM configured to communicate with a host computer system. The host computer system (not shown) communicates instructions and data with the RDIMM 100 using two high speed buses—the clock/address/control bus 101 and the data bus 102. The host computer system uses a lower-speed System Management Bus (SMBus) 103 to communicate with a Serial Presence Detect (SPD) EEPROM 104 to retrieve the module's configuration data (e.g., memory density, number of ranks, and latencies). The RDIMM includes a Register Control Device (RCD) 105 that is responsible for terminating the clock/address/control bus and retiming the signals to the DRAM devices 106. In a typical RDIMM, the RCD retimes the clock/address/control signals and drives these signals left and right with a delay. The delay of the address and control signals is specified as tPDM, and the delay of the clock signal is specified as tSTAOFF in the timing diagram shown in FIGS. 4 to 8. Retiming the signals and the physical location of the DRAM devices across the DIMM creates a temporal distribution of the DRAM components with increasing delay outwards from the center of the DIMM to the ends. For example, DRAM devices "3" and "4" in FIG. 1 have the shortest delay while DRAM devices "0" and "8" have the longest delay. The nominal timing of the clock and data strobes should be co-incident at the DRAM, but the DRAM specifications generally allow for some uncertainty such that the strobes are valid within a window around this nominal timing point.

Figure 2:
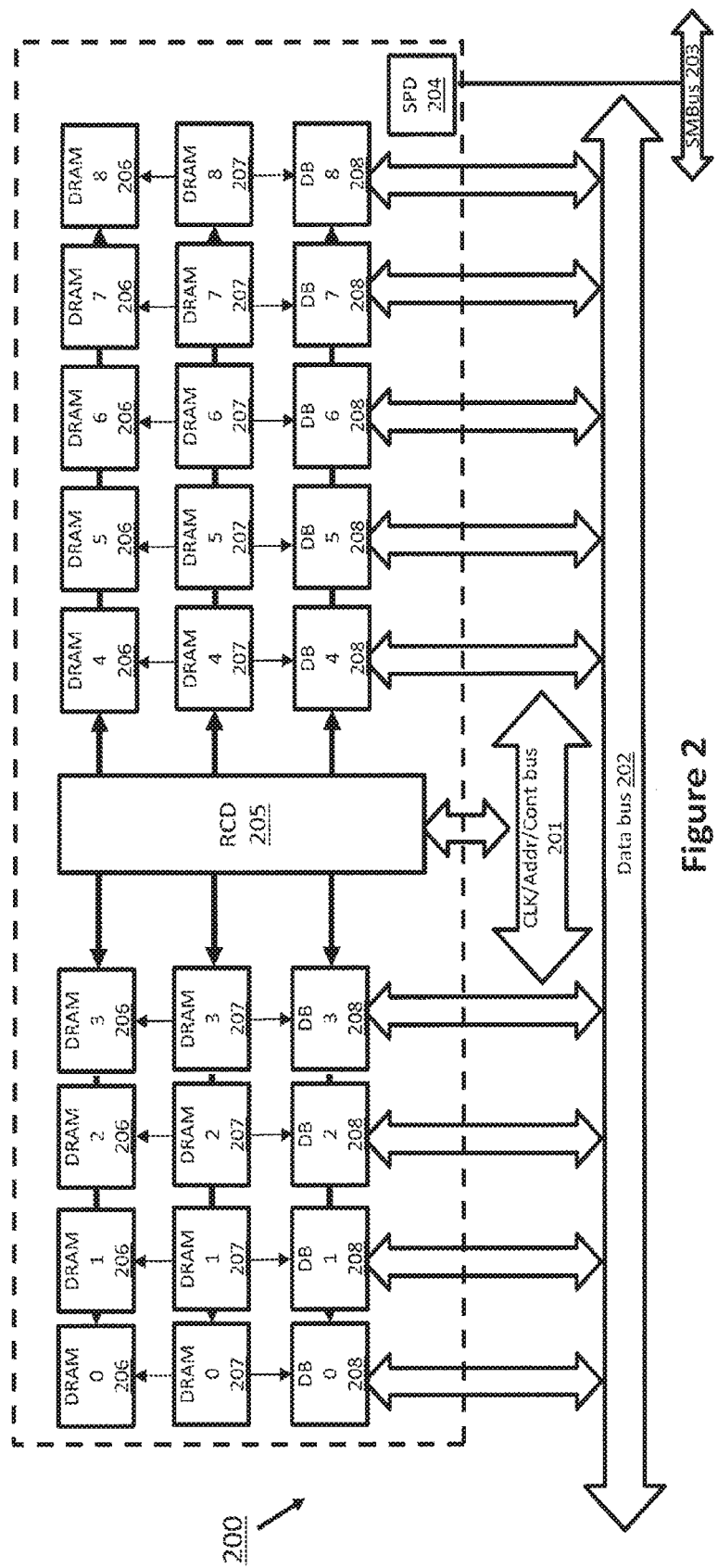
FIG. 2 illustrates a DDR-4 JEDEC compliant LRDIMM configured to communicate with a host computer system.
Figure 4:
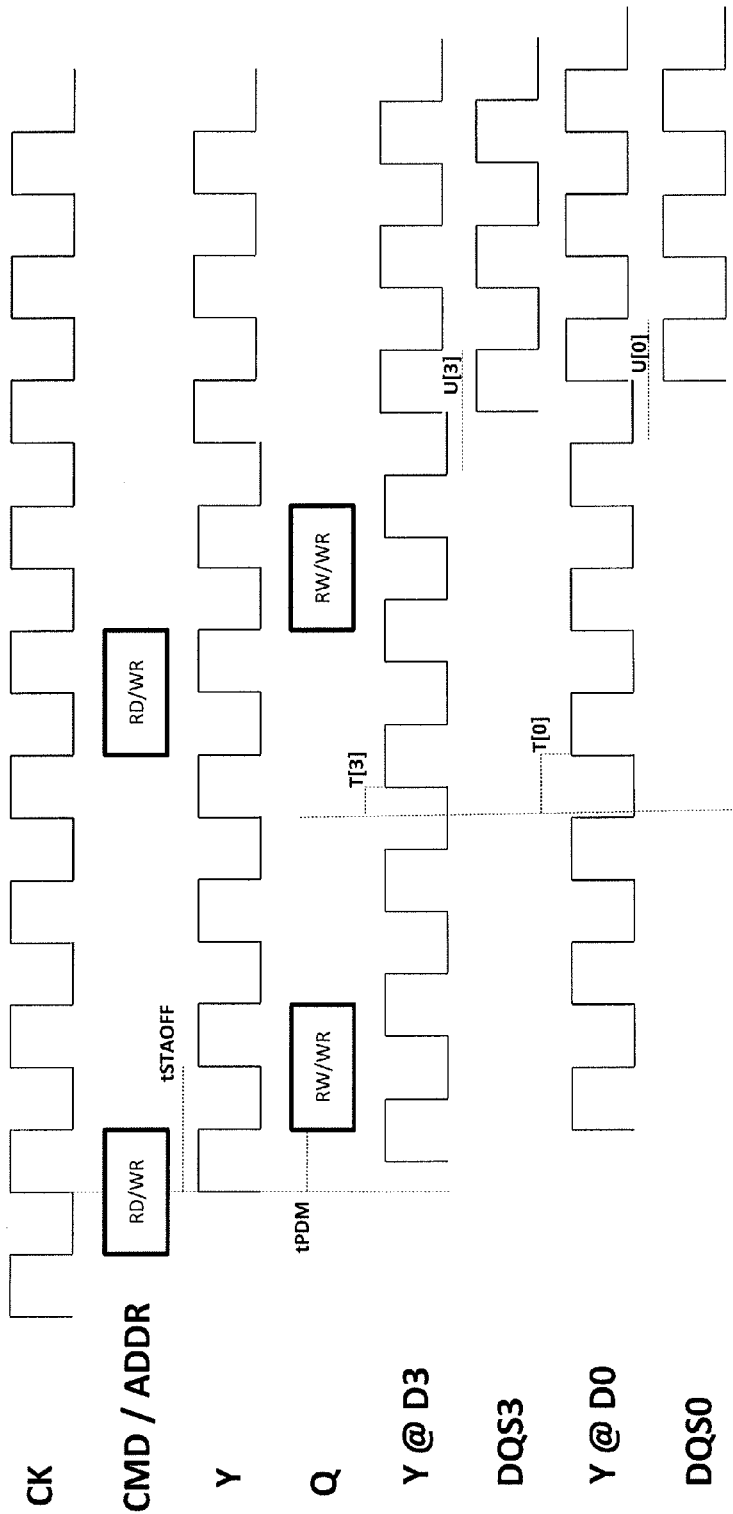
FIG. 4 illustrates an exemplary timing diagram for a read (or write) operation on an RDIMM.
Figure 5:
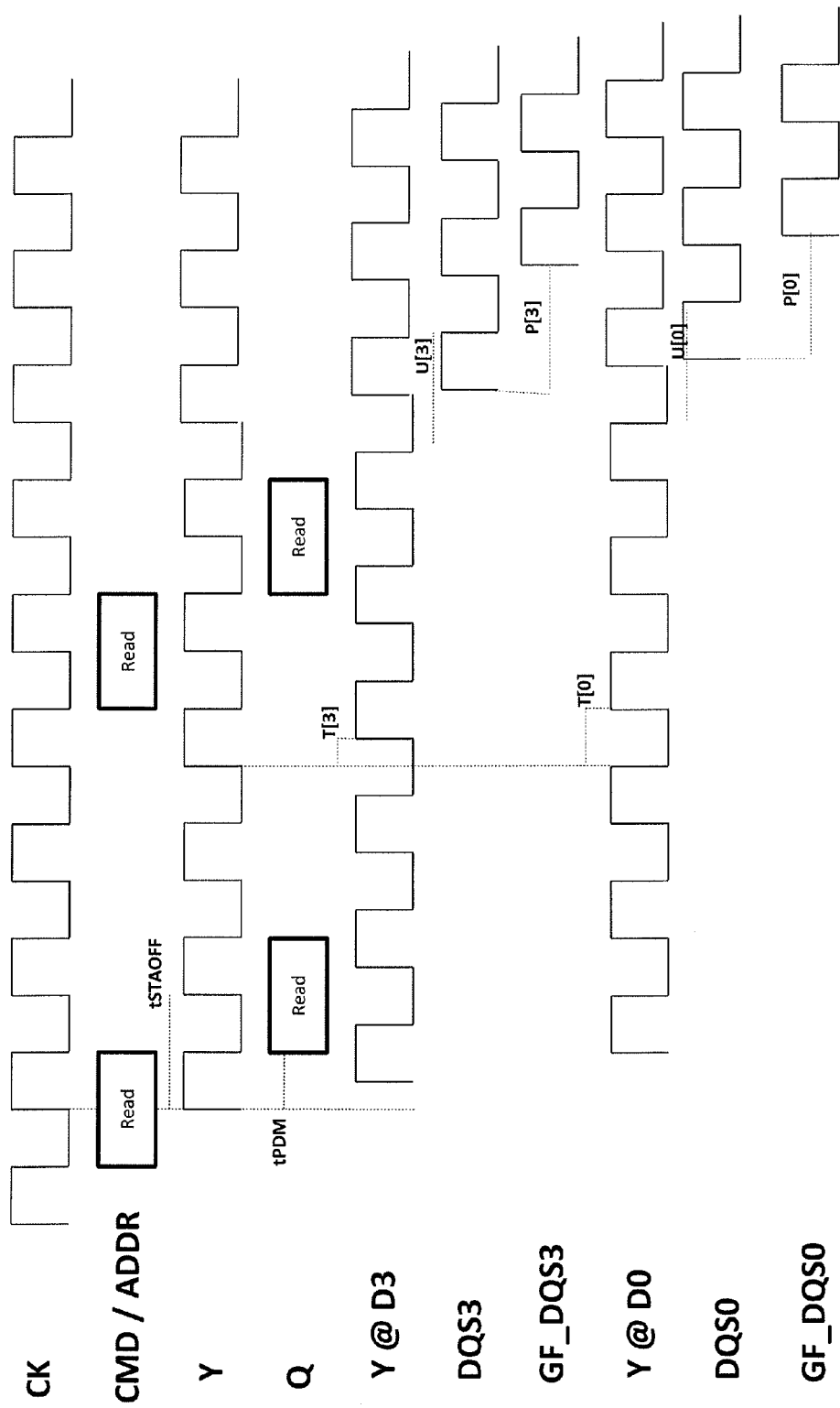
FIG. 5 illustrates an exemplary timing diagram for a read operation on an LRDIMM.

FIG. 2 shows a DDR-4 JEDEC compliant LRDIMM configured to communicate with a host computer system. LRDIMM 200 has 4 ranks of DRAM devices, which are shown as dual die DRAM packages 206 and 207. In addition to having an RCD 205, the LRDIMM 200 includes data buffers (DB) 208. While the temporal distribution of the DRAMs is similar to that of the DRAMS in the RDIMM 100, the addition of the DBs 208 causes the temporal distribution at the "gold fingers" (i.e., the pins of the DIMM for connecting to the host computer system) to be very different. Because of the propagation delay of the data signals through the DBs 208, the LRDIMM 200 has a different delay characteristic from that of the RDIMM shown in FIG. 1. FIGS. 4 and 5 illustrate the different timing characteristics between the RDIMM 100 and LRDIMM 200.

Figure 3:
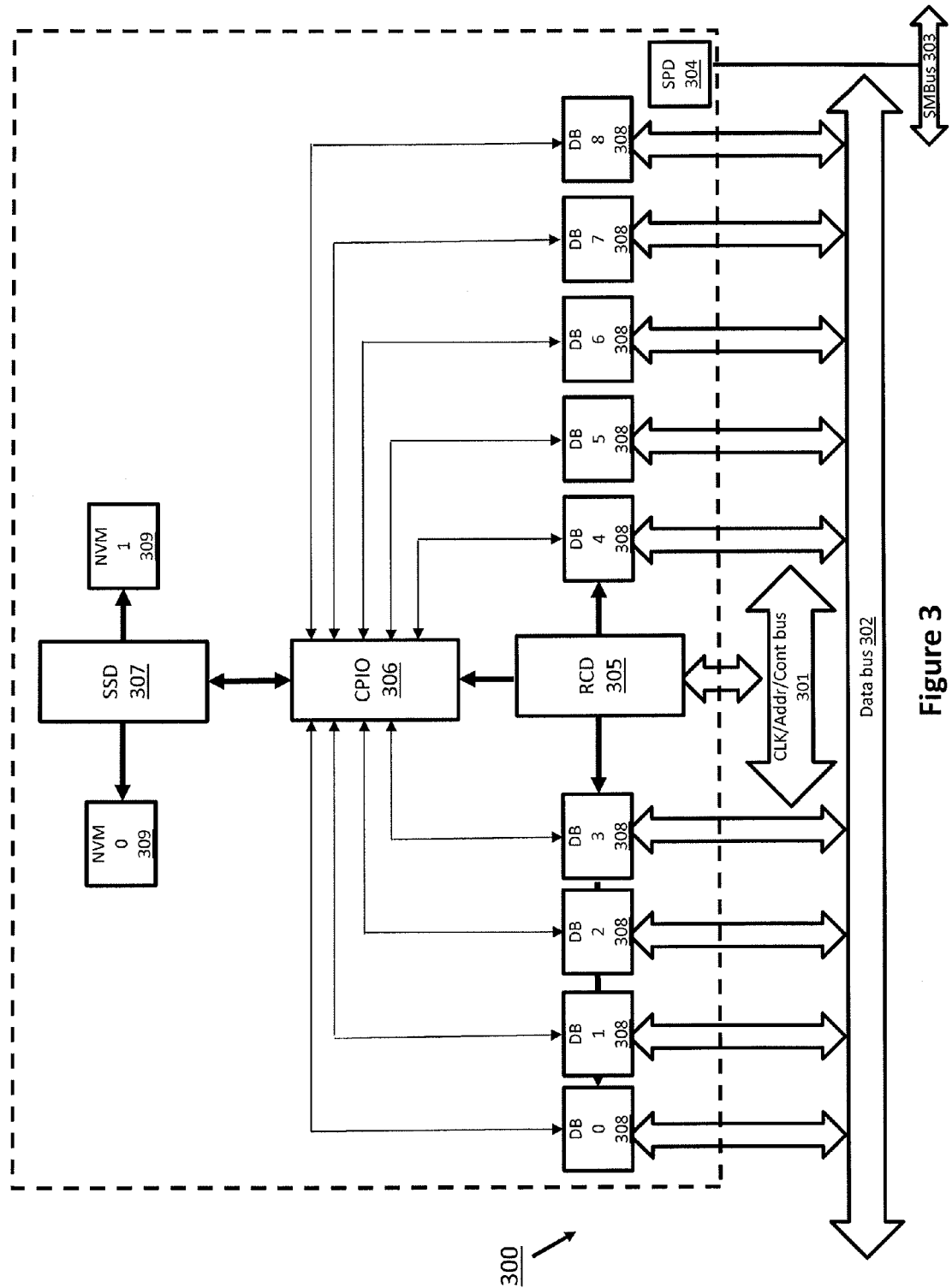
FIG. 3 illustrates a DDR-4 CPIO device implementing a DDR-4 JEDEC LRDIMM chipset, according to one embodiment.

FIG. 3 illustrates a DDR-4 CPIO device implementing a DDR-4 JEDEC LRDIMM chipset (CPIO LRDIMM), according to one embodiment. Differing from the modules shown in FIGS. 1 and 2, the CPIO device 300 does not have DRAM devices. Instead, the CPIO device includes a CPIO ASIC 306, a solid-state drive (SSD) controller 307, and non-volatile memory (NVM) devices 309. The CPIO ASIC 306 is centralized and placed near the RCD 305 and receives a clock signal that is similar in time to the closest DRAM devices of an RDIMM design. The trace lengths from the CPIO ASIC 306 to the DBs 308 are also similar to those between the RCD 305 to DB 308. Note that the function of a CPIO LRDIMM is not restricted to any particular application, but for the purpose of illustration here, the CPIO LRDIMM is shown as a non-volatile storage DIMM (i.e. a solid state disk drive).

FIG. 4 illustrates an exemplary timing diagram for a read (or write) operation on an RDIMM. The timing diagram is exemplary, and as such, the actual clock frequency is not given and the read and write delays are not necessarily representative of a DDR-4 DRAM. The concept, however, is still valid and generally does not change with larger delays, although the figure would require more space to fit in the longer timeframe. FIG. 4 shows the input clock (CK) and command/address signals (CMD/ADDR) received from the host computer system at the gold fingers of the RDIMM. The output clock (Y) and signals (Q) of the RCD device are shown for the left side of the RDIMM shown in FIG. 1. The timing concept for the right side is similar but is omitted for brevity. The clock signals received by the closest DRAM device to the RCD—DRAM device "3" (Y @ D3)—and the farthest DRAM device to the RCD—DRAM device "0" (Y @ D0)—are shown with a temporal shift T[3] and T[0] relative to Y. The Data Strobes (DQS3, DQS0) show the nominal placement of the strobes at the DRAM devices aligned to the local clock. The uncertainty windows U[0] and U[3] illustrate that the actual strobes can be offset from the clock and maintain proper operation.

FIG. 5 illustrates an exemplary timing diagram for a read operation on an LRDIMM. The timing at the DRAM is the same as that for the RDIMM shown in FIG. 4. The timing of the data strobes at the gold fingers (GF_DQS0 and GF_DQS3) are delayed relative to the DRAM due to the propagation delay of the DBs. The delays are indicated by P[0] and P[3]. In other words, the LRDIMM outputs the data to the host computer system later than an RDIMM would.

Figure 6:
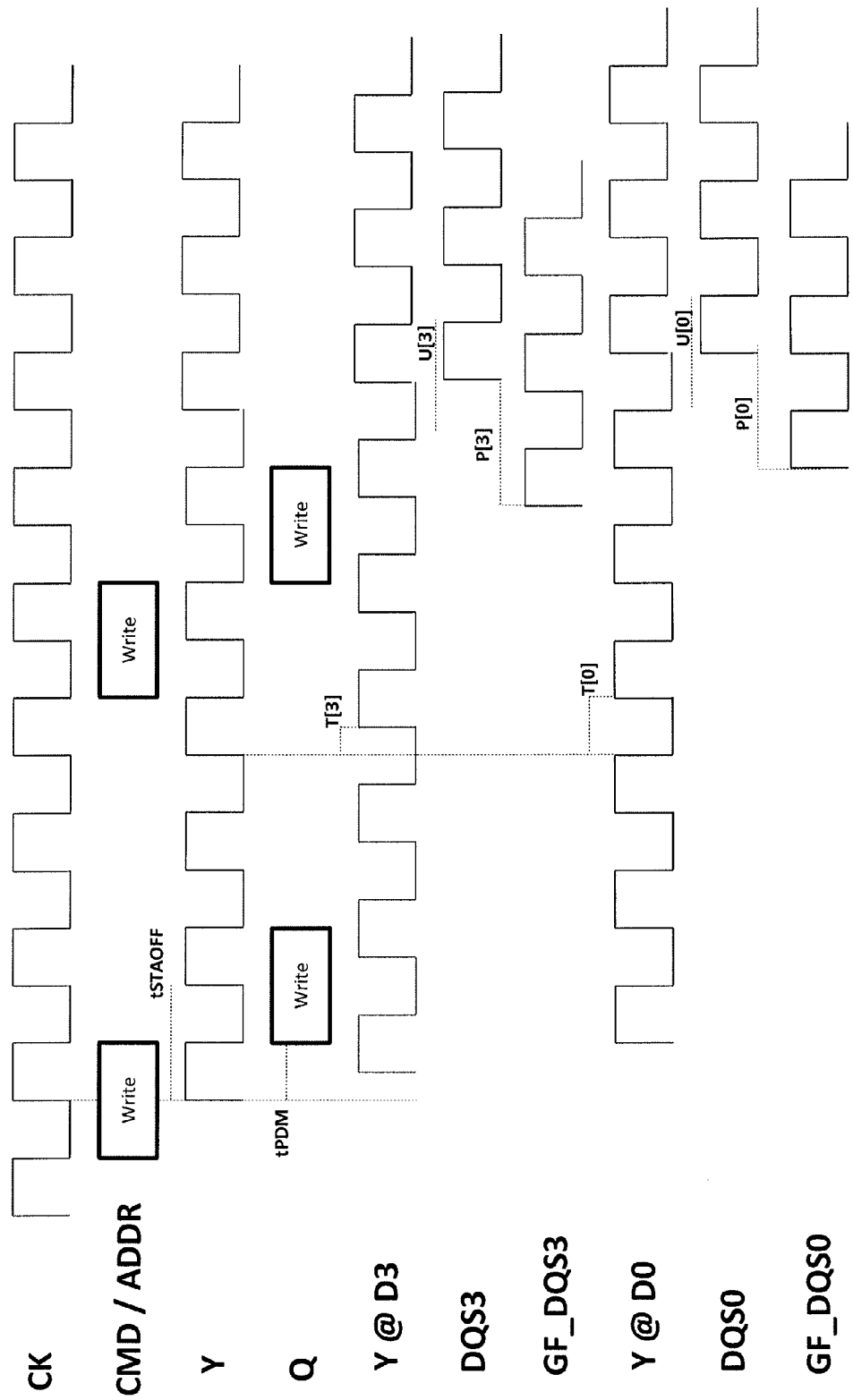
FIG. 6 illustrates an exemplary timing diagram for a write operation on an LRDIMM.

FIG. 6 illustrates an exemplary timing diagram for a write operation on an LRDIMM. Again, the timing at the DRAM is the same as that for the RDIMM shown in FIG. 4. The timing of the data strobes at the gold fingers is different from that shown in FIG. 5 because, during a write operation, data is driven by the host computer system. Thus, the data received by the DRAM is now delayed by amounts indicated by P[3] and P[0] and the host computer system must drive the data strobes earlier in order to have the data arrive at the DRAM at the nominal time.

In view of the timing differences between an RDIMM and an LRDIMM, the present application discloses a system and method for offsetting the timing of a CPIO LRDIMM such that it becomes compatible with the timing of an RDIMM. If the nominal timing of the signals at the gold fingers are equivalent, then an RDIMM and an LRDIMM can co-exist in a system without issue.

Figure 7:
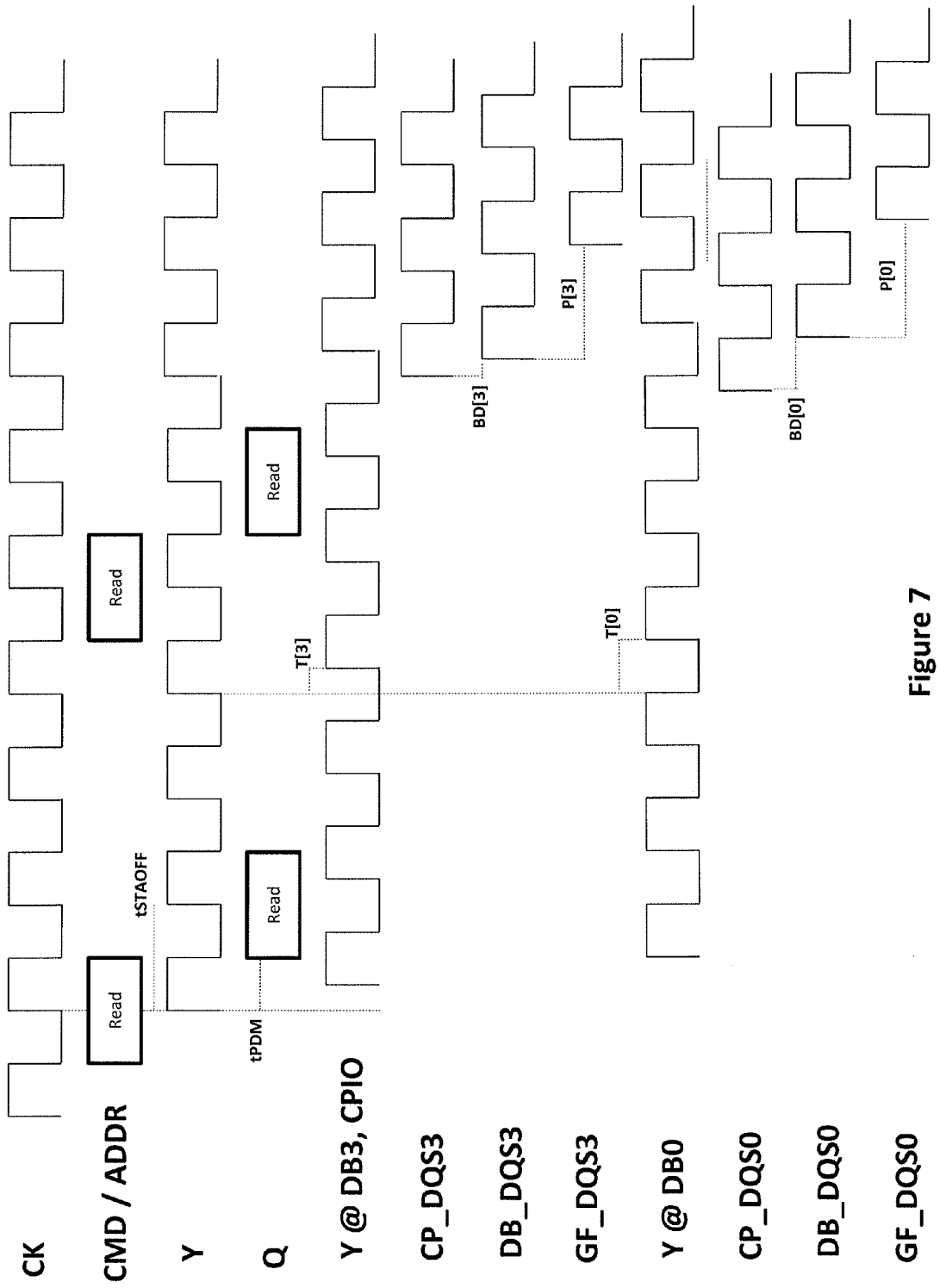
FIG. 7 illustrates an exemplary timing diagram for a read operation on a CPIO LRDIMM, according to one embodiment.

FIG. 7 illustrates an exemplary timing diagram for a read operation on a CPIO LRDIMM, according to one embodiment. The presently disclosed system and method offsets the timing of the data strobes at the gold fingers (GF_DQS3 and GF_DQS0) to match the timing of the data strobes (DQS3 and DQS0) shown in FIG. 4 for an RDIMM. For the purposes of illustration the propagation delay from the DRAM to the gold finger and from the DB to the gold finger is assumed to be the same and not shown in the diagram. Any small difference in practice can be accounted for in the design by a person of ordinarily skill in the art.

As can be seen in FIG. 7, in order to offset the delay incurred by the DBs such that the timing of data strobes at the gold fingers (GF_DQS3 and GF_DQS0) matches that of the data strobes (DQS3 and DQS0) shown in FIG. 4, the CPIO ASIC must launch the data strobe earlier. By launching the data strobes an amount of time P[3] and P[0] earlier, it allows the data strobes to propagate to the DB and then through the DB to arrive at the gold finger at around the same time as the data strobes DQS3 and DQS0. The propagation delay through the DB "0" is indicated as P[0] and the board delay from DB "0" to the CPIO ASIC is indicated as BD[0].

FIG. 8 illustrates an exemplary timing diagram for a write operation on a CPIO LRDIMM, according to one embodiment. Similar to the discussion regarding FIG. 7, the presently disclosed system and method offsets the timing of the data strobes at the gold fingers (GF_DQS3 and GF_DQS0) to match the timing of the data strobes (DQS3 and DQS0) shown in FIG. 4 for an RDIMM. For a write operation, the data arrives at the CPIO ASIC later due to the propagation delay through the DBs and the board delay from the DBs to the CPIO ASIC.

According to one embodiment, a CPIO LRDIMM is configured to control the data launch time for read operations and the data enable time for write operations. Conversely, a memory controller is configured to control the data launch time for write operations and data enable time for read operations. A CPIO LRDIMM that has a CPIO ASIC that has independent timing control of each data strobe (e.g., nibble or byte sized) can move the data by a sufficient amount either forward or back in time (relative to nominal timing of an RDIMM at the gold fingers) such that a CPIO LRDIMM and a standard RDIMM have the same data strobe timing at the gold fingers.

According to one embodiment, a host computer system implements both a CPIO LRDIMM and an RDIMM by performing memory channel training with modified training code. The host computer system's BIOS/UEFI code for performing memory training (Memory Reference Code (MRC)) is modified such that when a CPIO LRDIMM is detected (e.g., via the SPD), the host computer system's BIOS performs the standard LRDIMM training for the CPIO and the standard RDIMM training for any RDIMMs. The standard LRDIMM training may be to adjust the timing of the DB-to-DRAM interface for both reads and writes. In the case of a CPIO LRDIMM, the training would adjust the timing between the DBs and the CPIO ASIC. The CPIO ASIC may have its timing control loaded from non-volatile memory before MRC execution begins and the RCD/DBs would train as they would for an RDIMM.

Next, the MRC trains the host-to-DB side of the LRDIMMs in a manner similar to RDIMMs (which is how it currently works for LRDIMMs). The CPIO timing values are determined at the manufacturing stage of the CPIO LRDIMM. Given that the external timing (i.e., at the gold finger) for the DIMMs are correct by construction, the computer memory system works without issue.

According to one embodiment, a host computer system implements both a CPIO LRDIMM and an RDIMM without modifying the host computer system's training code. The CPIO LRDIMM is declared as an RDIMM in the SPD and is trained by the host computer system as a normal RDIMM. This declaration means that the MRC code would not perform the LRDIMM training. Therefore, the LRDIMM training is performed at some other point (e.g., during manufacturing) and the appropriate values are stored in a non-volatile memory and written into the RCD and DBs prior to RDIMM training. Furthermore, because the host computer system will attempt to configure the RCD as an RDIMM, rather than an LRDIMM, the CPIO LRDIMM monitors the RCD Register Control Words (RCW) and DRAM Mode Register Set (MRS) operations and rewrite the RCD control words as appropriate (i.e. return it to LRDIMM operation). Because the CPIO LRDIMM uses the DDR-4 bus for control/communications, it is hence is privy to all register configuration actions and can rewrite the RCD registers whenever it is necessary The present application discloses exemplary processes for determining the CPIO and RCD/DB timing parameters during manufacturing. Variants of these processes are possible and contemplated for LRDIMM chipsets from different manufacturers due to differences in the design of the devices. If the modified-MRC method described above is used, only the CPIO timing parameters are pre-determined (e.g., during manufacturing). If the unmodified-MRC method is used, then both the CPIO and RCD/DB timing parameters must be pre-determined. In normal MRC training of an LRDIMM, the DRAM memory devices have fixed timing parameters so the RCD/DB adjusts to match those parameters. For example, a methodology for calibrating the RCD/DB to the DRAM involves sweeping the timing parameters of the RCD/DB through its timing/state space and testing the communications path between DB and DRAM and then finding the optimal point for each nibble/byte lane at a given operating speed and for both reads and writes.

In the case of a CPIO LRDIMM, however, the RCD/DB timing parameters are fixed (to be RDIMM compatible) and the CPIO ASIC must adjust its parameters until it sends/receives data from the DB optimally. According to one embodiment, a method for calibrating the CPIO ASIC involves sweeping the timing parameters of the CPIO ASIC through its timing/state space (while keeping the RCD/DB fixed). Recall from above that the gold finger side of the DB should output data strobes coincident with the rising clock edge and have data strobes arrive from the host coincident with the rising edge. The timing parameters for the given DBs are based on the propagation delay through each DB. Given that there is variation in DBs based the device design and the individual device's manufacturing process, the actual delay through each DB should be determined first. Once the values are determined, the values are stored in a non-volatile memory on the CPIO LRDIMM so that the values can be programmed into the CPIO ASIC and RCD/DB as required during boot.

According to another embodiment, a method for calibrating the CPIO ASIC involves using a two-dimensional shmoo of the RCD/DB timings and the CPIO timings. A person of ordinarily skilled in the art would understand that this effectively determines the DB delays and optimal timings for the CPIO ASIC. Again, once the values are determined, the values are stored in a non-volatile memory on the CPIO LRDIMM so that the values can be programmed into the CPIO ASIC and RCD/DB as required during boot.

We claim:

1. A co-processing and input/output (CPIO) module with a load-reduction dual in-line memory module (LRDIMM) interface, the CPIO module comprising:
    a CPIO device;
    a CPIO variable timing control circuit; and
    a load-reduction dual in-line memory module (LRDIMM) interface configured to interface with a memory bus, the LRDIMM interface comprising data buffers to bridge data between the CPIO variable timing control circuit and the memory bus,
    wherein the CPIO variable timing control circuit is operatively coupled between the LRDIMM interface and the CPIO device, and is configured to provide variable timing control to signaling between the CPIO variable timing control circuit and the LRDIMM interface to at least partially offset latency between the memory bus and the CPIO variable timing control circuit so that the CPIO module is timing compatible with a registered dual in-line memory module (RDIMM).

2. The CPIO module of claim 1, wherein the CPIO variable timing control circuit is configured such that the variable timing control provided by the CPIO variable timing control circuit at least partially offsets latency caused by a data propagation delay of the data buffers.

3. The CPIO module of claim 2, wherein the CPIO variable timing control circuit is configured such that the variable timing control provided by the CPIO variable timing control circuit also at least partially offsets latency caused by a delay between the data buffers and the CPIO variable timing control circuit.

4. The CPIO module of claim 1, wherein the signaling between the CPIO variable timing control circuit and the LRDIMM interface comprises a plurality of data strobes and the signaling between the CPIO variable timing control circuit is configured to control launch times of the data strobes.

5. The CPIO module of claim 4, wherein the CPIO variable timing control circuit is configured to control the launch times of the data strobes to selectively move data strobes either forward or back in time relative to nominal timing of the RDIMM such that the CPIO module and the RDIMM have the same data strobe timing at the memory bus.

6. The CPIO module of claim 5, wherein the CPIO variable timing control circuit has independent timing control of each data strobe.

7. The CPIO module of claim 5, wherein the CPIO variable timing control circuit is configured such that:
    for a read operation on the CPIO module, the variable timing control provided by the CPIO variable timing control circuit causes data strobes to be launched earlier relative to nominal timing of the RDIMM; and for a write operation on the CPIO module, the variable timing control provided by the CPIO variable timing control circuit causes data strobes to be received later relative to nominal timing of the RDIMM.

8. The CPIO module of claim 1, wherein the LRDIMM interface is a Joint Electron Device Engineering Council (JEDEC) DDR-4 LRDIMM interface.

9. The CPIO module of claim 1, wherein the CPIO device comprises a non-volatile storage device.

10. The CPIO module of claim 1, wherein the CPIO device comprises a co-processor.

11. A computer system, comprising:
(a) a co-processing and input/output (CPIO) module;
(b) a memory bus;
(c) a host coupled to the CPIO module over the memory bus, the CPIO module comprising:
a CPIO device;
a CPIO variable timing control circuit; and
a load-reduction dual in-line memory module (LRDIMM) interface configured to interface with the memory bus, the LRDIMM interface comprising data buffers to bridge data between the CPIO variable timing control circuit and the memory bus,
wherein the CPIO variable timing control circuit is operatively coupled between the LRDIMM interface and the CPIO device, and is configured to provide variable timing control to signaling between the CPIO variable timing control circuit and the LRDIMM interface to at least partially offset latency between the memory bus and the CPIO variable timing control circuit so that the CPIO module is timing compatible with a registered dual in-line memory module (RDIMM).

12. The computer system of claim 11, further comprising at least one RDIMM coupled to the host over the memory bus.

13. The computer system of claim 11, wherein the CPIO variable timing control circuit is configured such that the variable timing control provided by the CPIO variable timing control circuit at least partially offsets latency caused by data propagation delay of the data buffers.

14. The computer system of claim 13, wherein the CPIO variable timing control circuit is configured such that the variable timing control provided by the CPIO variable timing control circuit also at least partially offsets latency caused by a delay between the data buffers and the CPIO variable timing control circuit.

15. The computer system of claim 11, wherein the signaling between the CPIO variable timing control circuit and the LRDIMM interface comprises a plurality of data strobes and the CPIO variable timing control circuit is configured to control launch times of the data strobes to selectively move data strobes either forward or back in time relative to non-final timing of the RDIMM such that the CPIO module and the RDIMM have the same data strobe timing at the memory bus.

16. The computer system of claim 15, wherein the CPIO variable timing control circuit has independent timing control of each data strobe.

17. The CPIO module of claim 15, wherein the CPIO variable timing control circuit is configured such that:
for a read operation on the CPIO module, the variable timing control provided by the CPIO variable timing control circuit causes data strobes to be launched earlier relative to nominal timing of the RDIMM; and
for a write operation on the CPIO module, the variable timing control provided by the CPIO variable timing control circuit causes data strobes to be received later relative to nominal timing of the RDIMM.

18. The computer system of claim 11, wherein the LRDIMM interface is a Joint Electron Device Engineering Council (JEDEC) DDR-4 LRDIMM interface.

19. The computer system of claim 11, wherein the CPIO device comprises a non-volatile storage device.

20. The computer system of claim 11, wherein the CPIO device comprises a co-processor.

* * * * *